(12) United States Patent
Berg et al.

(10) Patent No.: US 11,838,878 B2
(45) Date of Patent: Dec. 5, 2023

(54) METHODS AND UNITS OF A BASE STATION SYSTEM FOR HANDLING A SIGNAL FOR TRANSMISSION OVER A FRONTHAUL LINK BETWEEN THE UNITS

(71) Applicant: Telefonaktiebolaget LM Ericsson (publ), Stockholm (SE)

(72) Inventors: Miguel Berg, Sollentuna (SE); Daniel Cederholm, Sollentuna (SE); Chenguang Lu, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 256 days.

(21) Appl. No.: 17/414,711

(22) PCT Filed: Dec. 20, 2018

(86) PCT No.: PCT/SE2018/051346
§ 371 (c)(1),
(2) Date: Jun. 16, 2021

(87) PCT Pub. No.: WO2020/130896
PCT Pub. Date: Jun. 25, 2020

(65) Prior Publication Data
US 2022/0070797 A1    Mar. 3, 2022

(51) Int. Cl.
*H04W 52/52* (2009.01)
*H04W 92/20* (2009.01)

(52) U.S. Cl.
CPC ............ *H04W 52/52* (2013.01); *H04W 92/20* (2013.01)

(58) Field of Classification Search
CPC .............................. H04W 52/52; H04W 92/20
See application file for complete search history.

(56) References Cited

U.S. PATENT DOCUMENTS 8,989,088 B2 * 3/2015 Ling ................. H04L 27/26524
370/328
9,544,056 B2 * 1/2017 Cameirao ............. H04J 3/1617
(Continued)

FOREIGN PATENT DOCUMENTS

EP    2602948 A1    6/2013

OTHER PUBLICATIONS

International Search Report and Written Opinion dated Oct. 30, 2019 for International Application No. PCT/SE2018/051346 filed Dec. 20, 2018, consisting of 11-pages.
(Continued)

*Primary Examiner* — Hai V Nguyen
(74) *Attorney, Agent, or Firm* — Christopher & Weisberg, P.A.

(57) ABSTRACT

Disclosed is a method performed by a first unit of a base station system of a wireless communication network for handling a signal for transmission over a fronthaul link between the first unit and a second unit of the base station system. The base station system includes a base unit and a remote unit. The method includes receiving the signal having at least one complex value, each consisting of two subparts, each being represented by a first number of bits, and transmitting the signal over the fronthaul link to the second unit, wherein at least two subparts are represented in a subgroup, the subgroup being a binary codeword having an integer number of bits that is a multiple of a second non-integer number of bits allocated per subpart, the second non-integer number of bits being fewer than the first number of bits.

20 Claims, 6 Drawing Sheets

(56) References Cited

U.S. PATENT DOCUMENTS

| | | | |
|---|---|---|---|
| 11,601,951 B2* | 3/2023 | Eyuboglu | H04L 1/1812 |
| 11,646,929 B1* | 5/2023 | Shattil | H04L 27/2614 |
| | | | 370/329 |
| 11,671,299 B1* | 6/2023 | Shattil | H04B 7/0697 |
| | | | 370/329 |
| 11,700,602 B2* | 7/2023 | Eyuboglu | H04L 27/34 |
| | | | 370/336 |
| 2012/0250740 A1* | 10/2012 | Ling | H03M 7/30 |
| | | | 375/219 |
| 2014/0355991 A1* | 12/2014 | Cameirao | H04B 10/2575 |
| | | | 398/79 |

OTHER PUBLICATIONS

M.Garyantes; XRAN-FH.CUS.0-v02.00 Technical Specification; xRAN Fronthaul Working Group Control, User and Synchronization Plane Specification; xRAN; Jul. 20, 2018, consisting of 156-pages.

B. Guo et al.; LTE/LTE-A Signal Compression on the CPRI Interface; Bell Labs Technical Journal, vol. 18 No. 2; Sep. 2013, consisting of 17-pages.

\* cited by examiner

METHODS AND UNITS OF A BASE STATION SYSTEM FOR HANDLING A SIGNAL FOR TRANSMISSION OVER A FRONTHAUL LINK BETWEEN THE UNITS

CROSS-REFERENCE TO RELATED APPLICATIONS

This application is a Submission Under 35 U.S.C. § 371 for U.S. National Stage Patent Application of International Application Number: PCT/SE2018/051346, filed Dec. 20, 2018 entitled "METHODS AND UNITS OF A BASE STATION SYSTEM FOR HANDLING A SIGNAL FOR TRANSMISSION OVER A FRONTHAUL LINK BETWEEN THE UNITS," the entirety of which is incorporated herein by reference.

TECHNICAL FIELD

The present disclosure relates generally to methods and units of a base station system of a wireless communication network, for handling a signal for transmission over a fronthaul link between a base unit and a remote unit of the base station system. The present disclosure further relates to computer programs and carriers corresponding to the above methods and units.

BACKGROUND

In a distributed base station system, radio access network (RAN) processing is conducted by at least two separate units: a remote radio unit, aka remote unit, and a base band unit, aka base unit. The base unit is connected to the remote unit via a fronthaul link. The remote unit is connected to one or more antennas through which the remote unit wirelessly communicates with at least one wireless communication device, aka wireless device. The base unit is in its turn connected to other base station systems or base stations, and to a core network of a wireless communication system. The base unit is centralized and there may be more than one remote unit connected to each base unit. The base unit performs advanced radio coordination features such as joint detection, joint decoding, coordinated multi-point transmission (CoMP) to increase the spectrum efficiency and network capacity, as well as baseband processing, whereas the remote units perform radio frequency (RF) processing and transmission/reception of the RF processed signals.

Originally, the remote unit was designed to reduce the cable loss of the coaxial cables between an antenna tower top where the actual antennas are situated and the bottom of the antenna tower where the base station functionality is hosted. Therefore, before $5^{th}$ Generation of mobile communication (5G) e.g. New Radio (NR), i.e. at the $4^{th}$ Generation (4G) e.g. Long Term Evolution (LTE), the remote unit was rather simple and was mainly doing RF processing with limited baseband processing, if any.

When going from 4G to 5G, there is a need to increase the wireless communication capacity towards the wireless devices in order to be able to deliver requested data amounts per time period in 5G. One enabler of the mobile evolution towards 5G is massive Multiple Input Multiple Output (MIMO) in which each remote unit has a plurality of antennas. Massive MIMO exploits spatial multiplexing to improve spectrum efficiency by using arrays of active antennas. Active antenna arrays with large number of antennas give many degrees of freedom for beamforming and the increased directivity allows longer reach or communication using less transmit power. The remote unit is equipped with N antennas simultaneously serving K user-layers in the same time-frequency resource. The typical scenario is N>>K. e.g., N is 64, 128 or 256 while K is 8 or 16. As shown, the number of antennas N is quite large. To support such massive MIMO solutions, the required fronthaul link capacity needs to be increased in proportion to the increase of number of antennas, when using the current PHY-RF split between functionality of base unit and remote unit. This will dramatically drive up the fronthaul link costs. In order to lower the amount of data needed to be sent over the fronthaul link, different compression techniques are used, such as quantization with fewer bits.

Common Public Radio Interface (CPRI) was traditionally used for delivering In-phase and Quadrature (IQ) samples within the distributed base station system. Classical CPRI implementations often used 30 bits for one IQ sample, i.e. 15 bit I and 15 bit Q. Efficient data formats for IQ samples are becoming increasingly important with the advent of Massive MIMO, in order to lower the amount of data needed to be sent over the fronthaul link, as well as since wide 5G NR carriers require high sample rates. By decreasing the number of bits in the IQ format, fronthaul bitrate requirement is decreased proportionally. This is also true for other low-layer functional splits of functionality between the base unit and the remote unit, e.g. intra-PHY splits for LTE and NR.

IQ samples are often handled in blocks. For CPRI implementation, which uses a PHY-RF split of functionality, the block size might be related to the number of IQ samples from a carrier that fits in a CPRI basic frame. For functional splits where frequency domain IQ samples (e.g. per layer, per beam, or per antenna) are transported over the fronthaul link, block size might be related to the size of a resource block, which is 12 subcarriers in LTE and NR. This is the case e.g. for the xRAN Low Layer Split (LLS), which is described in "Control, User and Synchronization Plane Specification", technical specification XRAN-FH.CUS.0-v02.00, by the xRAN Fronthaul Working Group, published 2018. Currently, xRAN is merging with another consortium to form an Open RAN alliance (ORAN). The LLS specified in xRAN will be handled in ORAN working group 4.

Fixed point number formats are easy to implement but require many bits to achieve large dynamic range, which is needed for uplink samples. Floating-point can achieve larger dynamic range for a given number of bits. It is represented by $significand \times base^{exponent}$ where the base is usually decided in advance. The significand is sometimes called mantissa although this is not consistent with the original mathematical term mantissa. Block floating point (BFP), i.e. that one exponent is shared by multiple real samples, is sometimes used since it is more efficient than regular floating point when sample statistics do not change much within a block. Also, BFP fits well with the IQ sample block handling mentioned above. BFP formats can be specified e.g. as Ns×Nm+Ne where Ns is the number of samples, aka sub-parts sharing an exponent, Nm is the number of bits in each significand, and Ne is the number of exponent bits. The size C of a container, i.e. the number of bits necessary to store one complete block with significands and exponent, can be found by evaluating the format specification. For example, format 2×11+2 has a block size of 24 bits. A similar format is block scaling or block scaling factor (BSF) where a block of samples share a linear scale factor instead of an exponent.

The xRAN LLS specification supports different data formats for encoding of uplink/downlink resource element samples, including e.g. fixed point (udCompMeth=0000b), BFP (udCompMeth=0001b), and BSF (udCompMeth=0020b), where udCompMeth stands for user data compression method. UdCompMeth is a field name in User data compression header (udCompHdr) in the xRAN specification. The number of bits per sample, or significand, can be configured from 1 to 16. BSF uses an 8-bit unsigned linear scale factor with 1 integer bit and 7 bits after the binary point, allowing scale factors in the semi-open interval [0, 2[ in steps of 1/128. BFP uses a 4-bit exponent. Block size is always 24 (12 complex samples), both for BSF and for BFP.

The granularity of available link speeds for transport over the fronthaul link is quite coarse. This is true both for CPRI and for Ethernet-based transport. Further, the number of antennas, beams, or layers supported by a remote unit is typically a power of 2. If the desired configuration does not fit in a specific fronthaul link, either a higher link speed or more links are needed. In both cases, cost will increase. For example, for 100 MHz NR carriers sampled at 115.2 Msps, it would be possible to fit signals for 16 antennas in a 24.3 Gbps CPRI link if one IQ sample could fit in 6+6=12 bits. If more than 12 bits are needed, two 24.3 Gbps links are needed instead of one, which increases cost. Using prior art 6-bit uniform scalar quantization each for I and Q gives insufficient dynamic range. As soon as rms power is changed from the optimal value for the quantizer, Signal to Quantization Noise Ratio (SQNR) degrades. For uplink (UL) with its large dynamic range requirement, this is definitely not acceptable but it is also a problem for downlink (DL) since DL power can change e.g. due to beamforming or due to amount of scheduled traffic.

For DL, a format like 2×5+2, i.e. 2 real samples (I and Q) with 5-bit significand each and sharing a 2-bit exponent, fits the bit budget, but Signal-to-Quantization-Noise-Ratio (SQNR)=29.3 dB, which is very close to a 3GPP defined Transmission (Tx) Error Vector Magnitude (EVM) limit for 256-Quadrature Amplitude Modulation (QAM), where 3.5% EVM<=>29.1 dB SNR. This leaves almost no room for other impairments caused by phase noise and crest factor reduction. Shannon's rate-distortion bound gives an upper limit of 36.1 dB for 6-bit quantization of a memoryless Gaussian distributed source, indicating that there could be room for improvement in the coding. Consequently, there is a need of an improved method for coding or compressing data to be sent over a fronthaul link of a distributed base station system so that capacity of the fronthaul link is more efficiently used.

SUMMARY

It is an object of the invention to address at least some of the problems and issues outlined above. It is possible to achieve these objects and others by using methods, first units and second units as defined in the attached independent claims.

According to one aspect, a method is provided performed by a first unit of a base station system of a wireless communication network, for handling a signal for transmission over a fronthaul link between the first unit and a second unit of the base station system. The base station system comprises a base unit and a remote unit. The remote unit is arranged to transmit the signal wirelessly to, and receive from, one or more wireless devices. The first unit is the base unit and the second unit is the remote unit, or the first unit is the remote unit and the second unit is the base unit. The method comprises receiving the signal comprising at least one complex value, each complex value consisting of two subparts, a real part and an imaginary part, the subparts each being represented by a first number of bits, and transmitting the signal over the fronthaul link to the second unit, wherein at least two subparts of the at least one complex value are represented in a subgroup, the subgroup being a binary codeword comprising an integer number of bits that is a multiple of a second non-integer number of bits allocated per subpart, the second non-integer number of bits being fewer than the first number of bits.

According to another aspect, a method is provided performed by a second unit of a base station system of a wireless communication network, for handling a signal for transmission over a fronthaul link between the first unit and a second unit of the base station system. The base station system comprises a base unit and a remote unit. The remote unit is arranged to transmit the signal wirelessly to, and receive from, one or more wireless communication devices. Either the first unit is the base unit and the second unit is the remote unit, or the first unit is the remote unit and the second unit is the base unit. The method comprises receiving the signal over the fronthaul link from the first unit, the signal representing at least one complex value consisting of two subparts, a real part and an imaginary part, each subpart being represented by a non-integer number of bits, the signal comprising a subgroup comprising at least two subparts of the at least one complex value, the subgroup being a binary codeword consisting of an integer number of bits that is a multiple of the non-integer number of bits per subpart. Further, the method comprises decoding the at least two subparts from the received binary codeword based on the received signal comprising the codeword, information of the non-integer number of bits and on knowledge of the representation of each subpart by the non-integer number of bits.

According to another aspect, a first unit of a base station system is provided, the first unit being operable in a wireless communication network and configured for handling a signal for transmission over a fronthaul link between the first unit and a second unit of the base station system. The base station system comprises a base unit and a remote unit. The remote unit is arranged to transmit the signal wirelessly to, and receive from, one or more wireless communication devices. Further, the first unit is the base unit and the second unit is the remote unit, or the first unit is the remote unit and the second unit is the base unit. The first unit comprises a processing circuitry and a memory. The memory contains instructions executable by said processing circuitry, whereby the first unit is operative for receiving the signal comprising at least one complex value, each complex value consisting of two subparts, a real part and an imaginary part, the subparts each being represented by a first number of bits, and transmitting the signal over the fronthaul link to the second unit, wherein at least two subparts of the at least one complex value are represented in a subgroup, the subgroup being a binary codeword comprising an integer number of bits that is a multiple of a second non-integer number of bits allocated per subpart, the second non-integer number of bits being fewer than the first number of bits.

According to another aspect, a second unit of a base station system is provided, the second unit being operable in a wireless communication network and configured for handling a signal for transmission over a fronthaul link between a first unit and the second unit of the base station system. The base station system comprises a base unit and a remote unit. The remote unit is arranged to transmit the signal wirelessly to, and receive from, one or more wireless communication devices. The first unit is the base unit and the second unit is the remote unit, or the first unit is the remote unit and the second unit is the base unit. The second unit comprises a processing circuitry and a memory. Said memory contains instructions executable by said processing circuitry, whereby the second unit is operative for receiving the signal over the fronthaul link from the first unit, the signal representing at least one complex value consisting of two subparts, a real part and an imaginary part, each subpart being represented by a non-integer number of bits, the signal comprising a subgroup comprising at least two subparts of the at least one complex value, the subgroup being a binary codeword consisting of an integer number of bits that is a multiple of the non-integer number of bits per subpart, and decoding the at least two subparts from the received binary codeword based on the received signal comprising the codeword, information of the non-integer number of bits and on knowledge of the representation of each subpart by the non-integer number of bits.

According to other aspects, computer programs and carriers are also provided, the details of which will be described in the claims and the detailed description.

Further possible features and benefits of this solution will become apparent from the detailed description below.

BRIEF DESCRIPTION OF DRAWINGS

The solution will now be described in more detail by means of exemplary embodiments and with reference to the accompanying drawings, in which.

DETAILED DESCRIPTION

Briefly described, a solution is provided in which a non-integer number of bits are used for each sub-part of an IQ sample, i.e. for each I sample and for each Q sample, to be sent over the fronthaul link. By allowing a non-integer number of bits per sample (e.g. per significand in BFP), and not only integer number of bits as today, more freedom is introduced when designing the data format of the data to be transmitted over the fronthaul link, allowing improved performance closer to the limit given by rate-distortion theory. By forming subgroups of two or more sub-parts of IQ samples, where each subgroup has an integer number of bits, the non-integer number of bits per sub-part can be implemented efficiently. For an embodiment of the invention with an 11 bit subgroup having 5.5 bits per sub-part, i.e. 5.5 bits for I and 5.5 bits for Q, quantization noise is 1 dB lower than for a case without the invention where I uses 5 bits and Q uses 6 bits, or vice versa.

The invention is not limited to IQ samples in time domain but can also affect different low-layer splits where frequency domain IQ samples are sent, e.g. in element space, beam space or per MIMO layer. Similar problems may also affect transport of beamforming coefficients over a capacity-limited fronthaul link or network.

Figure 1:
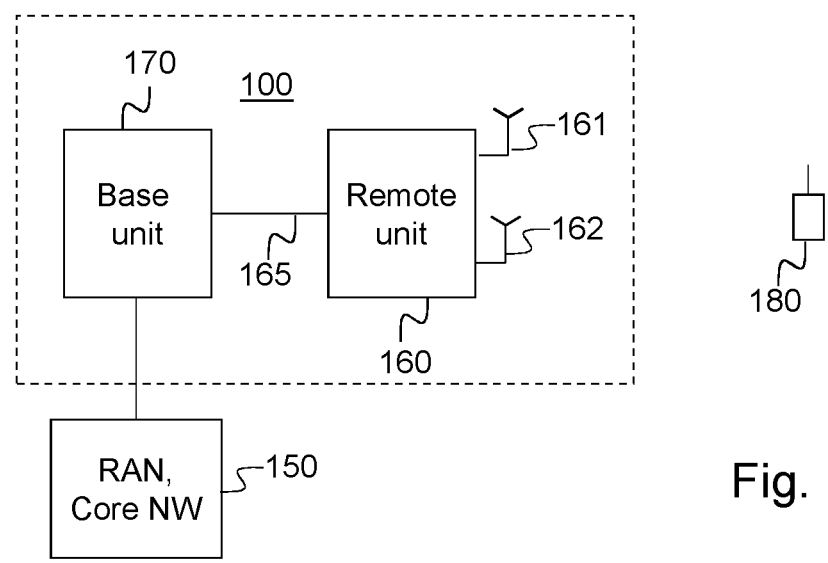
FIG. 1 is a schematic block diagram of a wireless communication system comprising a distributed base station system in which the present invention may be used.

FIG. 1 shows a base station system 100 of a wireless communication network. The base station system comprises a base unit 170, and a remote unit 160 connected via a transmission link 165 to the base unit. The transmission link 165 may be a point-to-point transmission link between the base unit and the remote unit, e.g. a physical transmission line, such as a copper cable or an optical cable or a point-to-point wireless connection. Alternatively, the transmission link 165 may be any kind of transmission network connecting the base unit with the remote unit, such as an Ethernet network. The transmission network may comprise microwave or millimeter wave links, optical links or electrical conductor links, e.g. metallic conductor links such as copper-based links. The transmission network may also be a wireless meshed network. The transmission network may comprise network switches and/or routers that performs the switching of signals sent over the links of the transmission network between the base unit and the remote unit. The remote unit 160 is in its turn connected to two or more antennas 161, 162, through which the remote unit transmits wireless signals to and receives wireless signals from wireless devices 180. The base unit 170 is normally connected to a plurality of remote units that may or may not use the same transmission connection for connection to the base unit. The base unit 170 of the base station system is in its turn, when connected to a wireless communication network, connected to other nodes of the network, such as other base stations, network controlling nodes etc. in a regular way for base stations in wireless communication networks. Such other network nodes are symbolized with a "RAN, Core network" node 150. The wireless communication network may be based on any kind of technology such as 5G New Radio (NR), Long Term Evolution (LTE), LTE Advanced, Wireless Local Area Networks (WLAN), Worldwide Interoperability for Microwave Access (WiMAX), WiMAX Advanced, Wideband Code Division Multiple Access (WCDMA) and Global system for Mobile communication (GSM) etc.

The wireless device 180 may be any type of device capable of wirelessly communicating with a remote unit 160 using radio signals. For example, the wireless device 180 may be a User Equipment (UE), a machine type UE or a UE capable of machine to machine (M2M) communication, a sensor, a tablet, a mobile terminal, a smart phone, a laptop embedded equipped (LEE), a laptop mounted equipment (LME), a USB dongle, a Customer Premises Equipment (CPE) etc.

Figure 2:
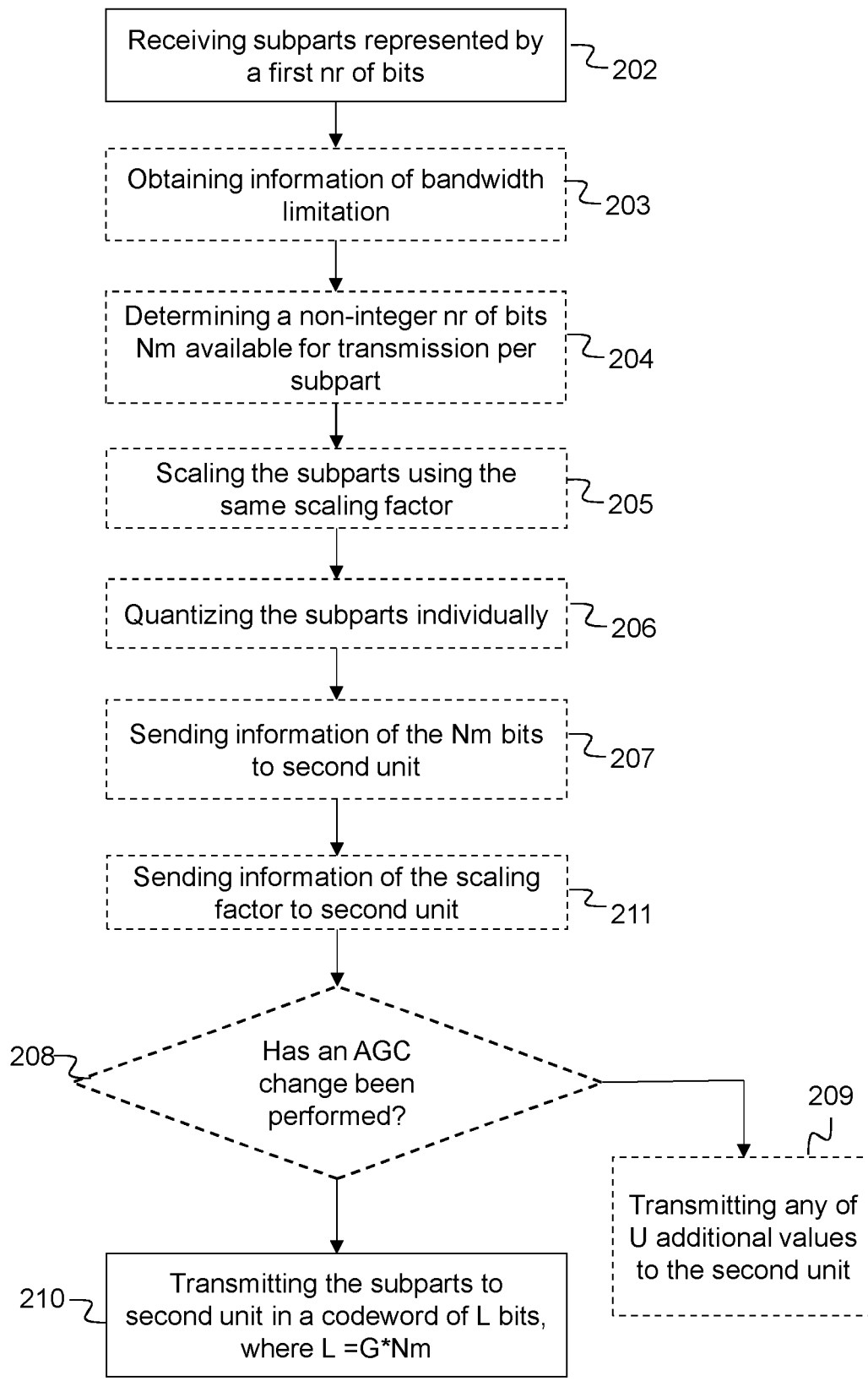
FIG. 2 is a flow chart illustrating a method performed by a first unit of a base station system, according to possible embodiments.

FIG. 2, in conjunction with FIG. 1, describes a method performed by a first unit of a base station system 100 of a wireless communication network, for handling a signal for transmission over a fronthaul link 165 between the first unit and a second unit of the base station system. The base station system 100 comprises a base unit 170 and a remote unit 160. The remote unit 160 is arranged to transmit the signal wirelessly to, and receive from, one or more wireless devices 180. The first unit is the base unit 170 and the second unit is the remote unit 160, or the first unit is the remote unit 160 and the second unit is the base unit 170. The method comprises receiving 202 the signal comprising at least one complex value, each complex value consisting of two subparts, a real part and an imaginary part, the subparts each being represented by a first number of bits, and transmitting 210 the signal over the fronthaul link 165 to the second unit, wherein at least two subparts of the at least one complex value are represented in a subgroup, the subgroup being a binary codeword comprising an integer number (L) of bits that is a multiple (G) of a second non-integer (Nm) number of bits allocated per subpart, the second non-integer number of bits being fewer than the first number of bits.

In other words, L=G*Nm. Further, G>1. The fronthaul link 165 may be any kind of connection connecting the remote unit 160 to the base unit 170, such as a dedicated wireline or wireless connection or a connection via a network, as long as the connection fulfils fronthaul requirements, e.g. in capacity and latency. The at least one complex value may be IQ samples or beamforming coefficients. In case the first unit is the remote unit 160, the signal is received 202 from the one or more wireless devices 180. In case the first unit is the base unit 170, the signal is received 202 from the RAN or the core network 150. The subparts can originate from the same complex value or be e.g. real parts from at least two complex values or imaginary parts of at least two complex values. The first number of bits may for example be 12 for each subpart. The second non-integer number of bits may for example be 5.5 for each subpart. The second non-integer number of bits may be selected based on bandwidth limitation information. The second non-integer number of bits may or may not be predetermined. The bandwidth limitation information may be known in advance or obtained from any unit of the wireless communication network. According to an embodiment, the selection of the second number of bits is made by network operations staff or a network management system, based on the bandwidth limitation information. A network operations staff may input the information of the second number of bits via a user interface, and the first unit receives the inputted information of the second number of bits from the user interface via the network. According to another embodiment, the selection of the second number of bits is made by the first unit based on the bandwidth limitation information. This could represent a more dynamic approach, as it takes into account the current bandwidth limitation. According to an embodiment, the at least two subparts might be scaled. The scaling can be performed in different ways, e.g. by a linear scale factor, aka block scaling, or by a logarithmic scale factor, aka block floating-point.

Hereby, a coding of the at least one complex value can be performed with a higher resolution than when the second number of bits per subpart is selected as integer numbers, at least for the cases where the bandwidth limitation is on a level that a non-integer number of bits is closer to the limitation, i.e. higher than an integer number of bits. A higher number of bits per complex value results in a higher signal quality, but when the number of bits are increased with integer values for the involved subparts, there is a risk that the total bit rate increases so much that extra capacity has to be installed for the delivery, when the fronthaul link delivers close to its capacity. By being able to select the second number of bits as fractions of a bit, signal quality can be increased without risking to exceed the capacity of the fronthaul link. By transmitting at least two subparts of complex values in a subgroup, and selecting the number of bits of the subgroup as an integer number, it is possible to use a non-integer number of bits per subpart.

According to an embodiment, the multiple (G) of the non-integer number of bits (Nm) per subpart is selected as the smallest integer that result in the number (L) of bits of the subgroup being an integer. By selecting G as the smallest integer that results in L being an integer results in less complexity for packing and unpacking compared to selecting a higher G.

According to another embodiment, within the subgroup, the at least two subparts, each being represented by the second number of bits (Nm), each can take on M=floor ($2^{Nm}$) different values, resulting in $M^G$ different values of the codeword being used for representing the at least two (G) subparts, and wherein the first unit and the second unit each has knowledge of the $M^G$ different values and how they are represented in the codeword. "M=floor($2_{Nm}$)" signifies $2^{Nm}$ rounded down to the closest integer. For example, if Nm=5.5, $2^{Nm}$=45.23 and then floor ($2^{Nm}$) is 45. As the second unit has knowledge of the values and how they are represented at the first unit, i.e. how they are coded, the second unit can interpret the meaning of the codeword as values of each subpart, for example sample quantization levels of IQ values.

According to a variant of this embodiment, the at least two subparts are represented as $M^{G-1} \cdot x_1 + M^{G-2} \cdot x_2 + \ldots + x_G$, or $M^0 \cdot x_1 + M^1 \cdot x_2 + \ldots + M^{G-1} \cdot x_G$ in the Nm·G bit long codeword, wherein $x_n$ (n=G) is any of 0 to M−1 different values representing the subpart $x_n$. Described are two possible ways of coding the at least two subparts in the codeword. For G=2, the codeword of the subgroup is formed as $M \cdot x_1 + x_2$ or $M \cdot x_2 + x_1$.

According to another variant, at least one of the additional values $U=2^{Nm \cdot G} - M^G$ of the codeword are used for indicating an Automatic Gain Control (AGC) change of a receiver of the first unit from a first range to a second range. The receiver of the first unit may have an amplifier or an attenuator on which the AGC is performed. Further, the method comprises obtaining 208 information that an AGC change has been performed, and transmitting 209, in response to the obtaining of information of an AGC change, any of the additional U values of the codeword to the second unit, instead of transmitting any of the $M^G$ values. Further, the first and the second unit in advance know the representation of each additional U values. The additional U values are also represented by a codeword containing L bits. According to an embodiment, the at least one additional U values indicate a value of the second range. The additional values are values that are not used for indicating values in the first range. The first value range is the range where the M different values of the subparts are situated. The second value range has a different extent than the first value range. The first and the second value range are pre-known by the first and the second unit. What the U values signifies in the second range is pre-known at the first and the second unit. To indicate AGC change is normally only used in uplink, i.e. from the remote unit to the base unit. Typically, it is used when analog gain has changed, early in the uplink chain of the remote unit. If analog gain is reduced to prevent a strong input signal from saturating the receiver, then digital gain is used to compensate by increasing digital gain by the same amount, keeping the total gain constant. In practice, this compensation is not ideal, which means that there might be a glitch (transient). Such a glitch may cause bit errors and therefore the base unit wants to know when it happens, in order to mitigate the problem e.g. by reducing the glitch or by not trusting samples when the glitch occurs.

Further, the at least one additional U values of the codeword may indicate different values of the at least two subparts in the second value range. The U values may hereby be used to indicate a value in the second range and not just that a change has been performed, however the values in the second range are much fewer than the values in the first range and therefore coarser.

According to an embodiment, there will be $U=2^{Nm \cdot G}-M^G$ additional values left of the codeword, at least one of the additional values U of the codeword being used for indicating values of any of the at least two subparts being outside the $M^G$ different values.

According to another embodiment, the method further comprises scaling 205 the at least two subparts using the same scaling factor. Further, the second number of bits (Nm) are used for representing scaled values of the at least two subparts. Also, the transmitting 210 of the signal comprises transmitting the subgroup in a block, the block comprising, except for the subgroup, one or more additional bits representing the scaling factor common to the at least two subparts in the subgroup. Further, information of the scaling factor may be sent 211 to the second unit. According to an embodiment, the scaled values may be the significand of each of the at least two subparts and the scaling factor may be the exponent common to the at least two subparts.

According to a variant of this embodiment, the block comprises the subgroup and at least one additional subgroup, each additional subgroup comprising scaled values of at least two subparts, the block further comprising additional bits for each additional subgroup, the additional bits representing a scale factor common to the subparts in each additional subgroup. As the scale factor, e.g. exponent, is common to more than one subpart, one or more extra bit can be saved per block. In certain cases, clever positioning of scale factor bits may result in better alignment to native data types. This might be a small advantage when L is large. For example, if we have the format 8×7.5+4 (Nm=7.5 bits, G=2, Ns=8, and Ne=4): Each subgroup will need 15 bits and two subgroups will thus need 30 bits. The whole block consists of four subgroups. Now, if we position two scale factor bits together with the bits from two subgroups, then we have a 32-bit word, which might be natively handled by a processing circuitry. The remaining part of the block is then in another 32-bit word, where the remaining subgroups and scale factor bits could be placed in the same way as in the first 32-bit word. No subgroup spans the 32-bit word. Without clever placement of the scale factor bits, we could have one subgroup that spans the two 32-bit words. This might be ok on a machine with 64-bit support but increases complexity for a 32-bit machine.

According to another embodiment, the method further comprises obtaining 203 information of a bandwidth limitation over the fronthaul link 165, determining 204, based on the obtained 203 bandwidth limitation information, the second non-integer number of bits (Nm) available per subpart, and sending 207 information of the determined second non-integer number of bits (Nm) to the second unit. Hereby, it is possible to change the coding at the first unit during communication. This may be of special interest e.g. in xRAN. The information of the second number of bits (Nm) may be sent over the fronthaul link to the second unit as a control message. Alternatively, the information of the second number of bits may be sent to the second unit in a header of the user plane data. The bandwidth limitation could be a limitation on bits per complex value, e.g. 12 bits, or bits per subpart, e.g. 6.

According to another embodiment, the method further comprises quantizing 206 the subparts individually using a scalar codebook. After the subparts are quantized they are packed into subgroups. In other words, after the at least two subparts have been quantized individually they are transmitted in the subgroup that is a binary codeword consisting of the integer number (L) of bits that is a multiple (G) of the second non-integer (Nm) number of bits allocated per subpart.

Figure 3:
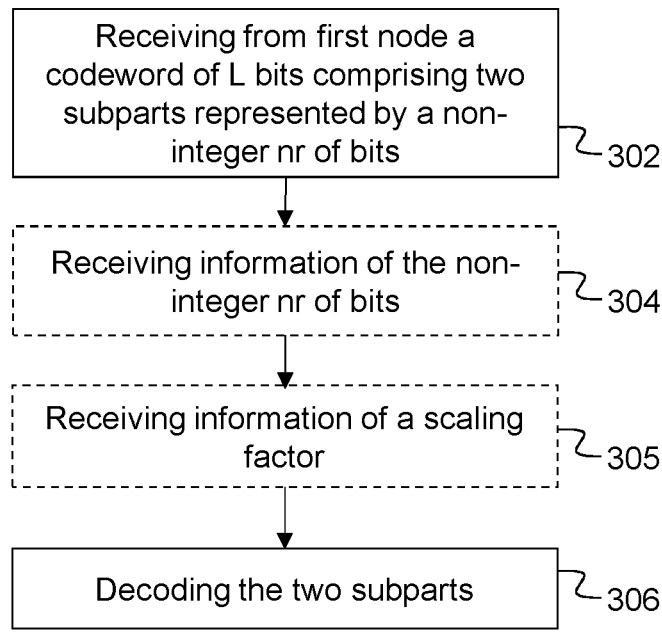
FIG. 3 is a flow chart illustrating a method performed by a second unit of a base station system, according to possible embodiments.

FIG. 3, in conjunction with FIG. 1 shows a method performed by a second unit of a base station system 100 of a wireless communication network, for handling a signal for transmission over a fronthaul link 165 between the first unit and a second unit of the base station system. The base station system comprises a base unit 170 and a remote unit 160. The remote unit 160 is arranged to transmit the signal wirelessly to, and receive from, one or more wireless communication devices 180. Either the first unit is the base unit 170 and the second unit is the remote unit 160, or the first unit is the remote unit 160 and the second unit is the base unit 170. The method comprises receiving 302 the signal over the fronthaul link 165 from the first unit, the signal representing at least one complex value consisting of two subparts, a real part and an imaginary part, each subpart being represented by a non-integer (Nm) number of bits, the signal comprising a subgroup comprising at least two subparts of the at least one complex value, the subgroup being a binary codeword consisting of an integer number (L) of bits that is a multiple (G) of the non-integer (Nm) number of bits per subpart. further, the method comprises decoding 306 the at least two subparts from the received binary codeword based on the received signal comprising the codeword, information of the non-integer number of bits and on knowledge of the representation of each subpart by the non-integer number of bits.

The second unit needs to know how the bits of the codeword are to be interpreted in order to be able to decode the codeword. Therefore, the second unit may have pre-knowledge of how many non-integer number of bits that are used and how the respective subpart is represented in the codeword by the non-integer number of bits. For example, the second unit needs to know at least two of the following: G, L, and {M or Nm}. However, if it is known at the second unit that G is the smallest integer that makes L an integer value, it would be enough to for the second unit to know either Nm alone or both G and L. The second unit also needs information whether subgroups are formed by e.g. a real part and an imaginary part of one and the same complex value, e.g. an I and Q value of the same complex value, or by multiple real values or multiple imaginary values of different complex values. Decoding can be done in different ways but in general, for G=2 and if S is the subgroup value (e.g. $S=M \cdot x_1+x_2$) then we have: $x_1=\text{floor}(S/M)$, $x_2=S-M \cdot x_1$. Another possible way for decoding the same is $x_2=S$ modulo M, $x_1=(S-x_2)/M$.

According to an embodiment, the method further comprises receiving 304 the information of the non-integer number of bits from the first unit. If the second unit does not have pre-knowledge of the non-integer number of bits used, it may receive this information from the first unit.

According to another embodiment, within the subgroup, the at least two subparts, each being represented by the second number of bits (Nm), each can take on $M=\text{floor}(2^{Nm})$ different values, resulting in $M^G$ different values of the codeword being used for representing the at least two (G) subparts, and wherein the first unit and the second unit each has knowledge of the $M^G$ different values and how they are represented in the codeword.

According to an alternative, at least one of additional values $U=2^{Nm \cdot G}-M^G$ of the codeword are used for indicating an Automatic Gain Control (AGC) change of a receiver of the first unit from a first range to a second range. Then the method further comprises receiving any of the additional U values of the codeword from the first unit, instead of receiving any of the $M^G$ values. Further, the first and the second unit in advance knows the representation of the at least one additional values. The at least one additional U values may each indicate a value of the second range.

According to another embodiment, the second number of bits (Nm) are used for representing scaled values of the at least two subparts, wherein the receiving 302 of the signal comprises receiving the subgroup in a block, the block comprising, except for the subgroup, one or more additional bits representing a scaling factor common to the at least two subparts in the subgroup. In this embodiment, the second unit may either know in advance which bits are used for the scaled values and which bits are used for the scaling factor, and how the bits are to be interpreted, or information of the bits and their interpretation are received by the second unit from the first unit. Further, information of the scaling factor may be received 305 by the second unit from the first unit.

In the following, embodiments are described wherein the subparts are exemplified by I samples and Q samples. The number of possible quantization levels per sample for Nm significand bits is $M=\lfloor 2^{NM} \rfloor$. Rounding the quantization levels M to an integer is needed for non-integer number of significand bits. A subgroup of G samples is formed, containing G×Nm bits. Here, G is selected as the smallest integer value where the subgroup contains an integer number of bits. Thus, the possible fractions in Nm are determined by G. If data is processed in blocks, G is preferably selected as a product of one or more prime factors in the block size. One block, e.g. a BFP block sharing a common exponent, will then contain an integer number of subgroups. Within a subgroup, values are encoded as a conversion from a G-digit base M number to binary. This is an efficient enumeration of the $M^G$ quantizer codewords in the G-dimensional space. When complex samples, e.g. IQ-samples, are processed, a subgroup can contain both I and Q samples or there could be separate subgroups for I values and Q samples, respectively. In case of BFP blocks, one or more subgroups are concatenated together with exponent bits to represent the whole BFP block.

Unused codes in a subgroup can be used for control signaling, e.g. to indicate special events like AGC change, or to represent IQ samples that are too large to fit in the significand range, hereby avoiding exponent increase, e.g. if only the I sample or the Q sample slightly exceeds the significand range. The number of unused or "special" codes in a subgroup is $u=2_{G \times Nm}-M^G$.

As mentioned, the embodiments described are not restricted to block floating point but could also be applied for e.g. block scaling or even for a block of fixed-point numbers.

As an example of non-integer number of significand bits, one can use e.g. 5.5 bits each for the I sample and the Q sample of an IQ sample. This results in $M=\lfloor 2^{5.5} \rfloor=45$ different quantization levels each for Cartesian representation. Then a pair of one I sample and one Q sample can be encoded as M×I+Q or M×Q+I, into an 11-bit wide subgroup. Alternatively, a subgroup could be formed by two I samples or two Q samples. In this encoding, we assume that I and Q are represented as indices: $\{0, 1, \ldots, M-1\}$. After encoding, each subgroup can easily be concatenated with other subgroups or other information if needed, e.g. by using bit shifts. Multiplication by a constant can be optimized, e.g. using combination of shift and add operations. There will be $2_{11}-45^2=23$ special codes in this case. Details on how to use the special codes will be presented later in this text.

Figure 4:
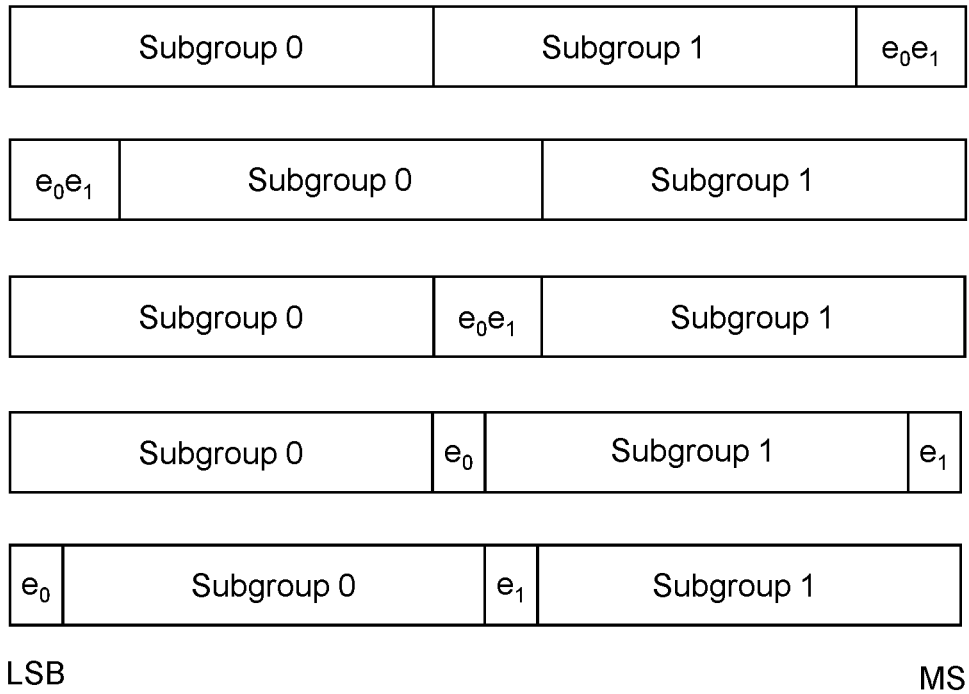
FIG. 4 is a diagram illustrating different possible ways of packing subgroups in a block, according to further possible embodiments.

FIG. 4 shows five examples of different ways to pack subgroup bits and exponent bits of a block in one larger word size. This might be needed e.g. if the implementation is done in software, e.g. on a general purpose processor, or a digital signal processor. It is typically also needed for packet-based transport since they normally assume byte- or word-aligned data transfers. For CPRI transport, FIG. 4 could represent bit ordering on the serial interface instead of packing into a large word size. The example is for format 4×5.5+2, where each subgroup of two significand values is 11 bits wide and there are two exponent bits. As can be seen, exponent bits can be placed in different positions depending on implementation preference. Since subgroups always have integer number of bits, they can be handled like significand values with large bit width. In this example, all subgroups and exponent bits in the whole block are packed in one big word but this does not always have to be the case. It is not always the case that an integer number of machine words can represent one block or vice versa. "LSB" in FIG. 4 stands for Least Significant Bit and "MSB" stands for Most Significant Bit.

Figure 5:
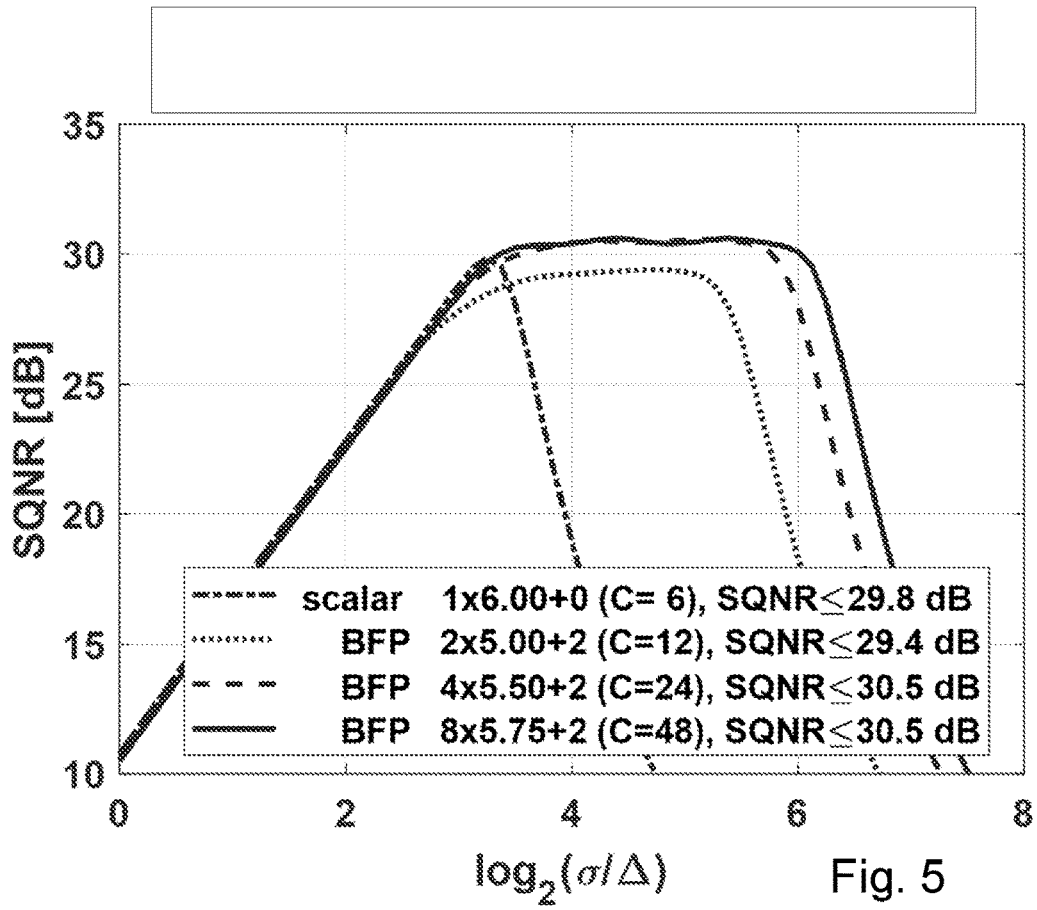
FIG. 5 is a Cartesian co-ordinate system showing SQNR as a function of $\log_2$ of signal Root Mean Square (RMS) power normalized to quantization step size, comparing simulation results for two prior art formats to two format embodiments of the invention.

The inventors have performed simulations to show the improvements achieved with embodiments of the present invention. FIG. 5 shows SQNR versus $\log_2$ of signal RMS power normalized to the quantization step size. FIG. 5 shows simulation results for four different formats with 12 bit IQ samples; two prior art formats having integer number of significand bits, firstly a uniform or scalar 6-bit format: 1×6+0, and secondly a BFP-format: 2×5+2, and two formats according to embodiments of this invention having non-integer number if significand bits: a first BFP-format: 4×5.5+2, having Nm=5.5 bit significand, subgroup size G=2, subgroup width 11 bits, and two subgroups per BFP block, and a second BFP-format: 8×5.75+2 has Nm=5.75 bit significand, subgroup size G=4, subgroup width 23 bits, and two subgroups per BFP block. As can be seen in FIG. 5, the uniform scalar format has a very narrow peak with good SQNR, which is not desired. The prior art BFP-format 2×5+2 has lower maximum SQNR but larger dynamic range where SQNR is usable. The inventive first and second BFP-formats 4×5.5+2 and 8×5.75+2 have both better maximum SQNR and larger dynamic range than the prior art formats. Actually, a better performance is achieved for the same total number of bits per IQ sample, including exponent bits.

In the previously referred xRAN technical specification XRAN-FH.CUS.0-v02.00 only integer number of significand bits are allowed when encoding resource elements or beam weights. In case it is desired to fit e.g. 1600 MHz of 5G NR bandwidth in a 25 Gbps fronthaul link, it could happen that 7-bit significand does not give low-enough quantization noise for high-order modulation while 8-bit significand might not fit into the bit rate budget when including overhead etc. By adding a control or management message containing e.g. a rational scaling factor, the currently supported xRAN user data (resource element) IQ widths (udIqWidth) of 1-16 bits can be rescaled to include fractional significand width. A similar scaling factor could be added to control the beamforming weight IQ width (bfwIqWidth). This rational scaling value could consist of e.g. two values, a numerator (wNum) and a denominator (wDen), so that the desired significand width $$N_m = \frac{wNum}{wDen} udIqWidth.$$

It is also possible to shift the range by adding an offset. As an alternative, if it is only of interest to have subgroups with G=2 or G=1, it is enough to have a single bit that controls whether to add (or subtract) 0.5 to the existing udIqWidth or bfwIqWidth, instead of two values wNum and wDen.

In the simplest case, wNum is always 1, which means that only wDen has to be sent. This limits the maximum subgroup size to 16 bits. Values of interest for wDen would likely be small positive integers, e.g. 1-4, which could be encoded using two bits but more bits could be used if a larger range is needed. As a minimum, one bit is needed to switch between wDen=1, i.e. normal integer significand widths, and wDen=2. When wDen=2, udIqWidth could take values in the set {0.5, 1, 1.5, . . . 8} bits. This set contains both integer and non-integer values. Another option is that when wDen=2, wNum is automatically set to 2 and an offset of 1 is subtracted so that the possible significand widths become {0.5, 1.5, 2.5, . . . , 15.5}. Other offsets are also possible. Instead of sending wDen as a new bit field, it is possible to re-interpret one of the 4 bits in udIqWidth for this purpose. This would limit the number of possible fractional significand widths to 8 but this could be acceptable in some cases.

Further, for more flexibility, more values for wNum could be allowed. The overhead of sending wNum and wDen is small since it does not have to be sent every Physical Resource Block (PRB), only when format change is needed. In xRAN, this might be e.g. once per section. One section can contain resource elements for multiple PRBs belonging to one user. As an option, if it is desired to change bit width dynamically per PRB, the 4 (reserved) zero padding bits in xRAN user data compression parameter (udCompParam) when using block floating-point, could be used to send wNum and wDen, or only wDen. This new interpretation of these bits could be signaled in a control or management message, or as a new compression format in (udCompMeth) field, or the bfwCompMeth field for beam weights, using one of the reserved values.

Figure 6:
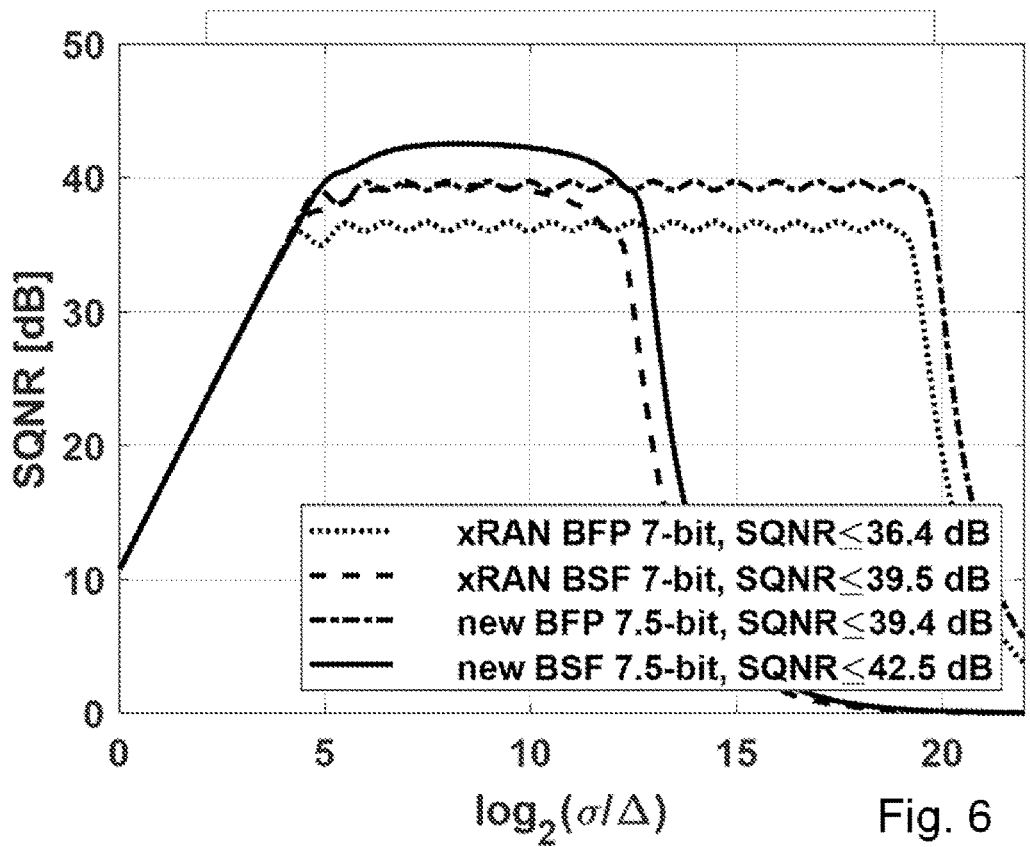
FIG. 6 is a Cartesian co-ordinate system showing SQNR as a function of $\log_2$ of signal Root Mean Square (RMS) power normalized to quantization step size, comparing simulation results for two prior art xRAN formats to two format embodiments of the invention.

FIG. 6 shows simulation results for two currently supported xRAN formats having 7-bit significand for BFP: xRAN BFP 7-bit and 7-bit scaled value for BSF: xRAN BSF 7-bit, as well as results for two formats according to embodiments of the invention having 7.5 bit scaled value or significand: BFP 7.5 bit and BSF 7.5 bit. As expected, SQNR improves by 3 dB since 0.5 bit of precision was added. Block size is 24 samples (12 complex samples) in all cases.

Figure 7:
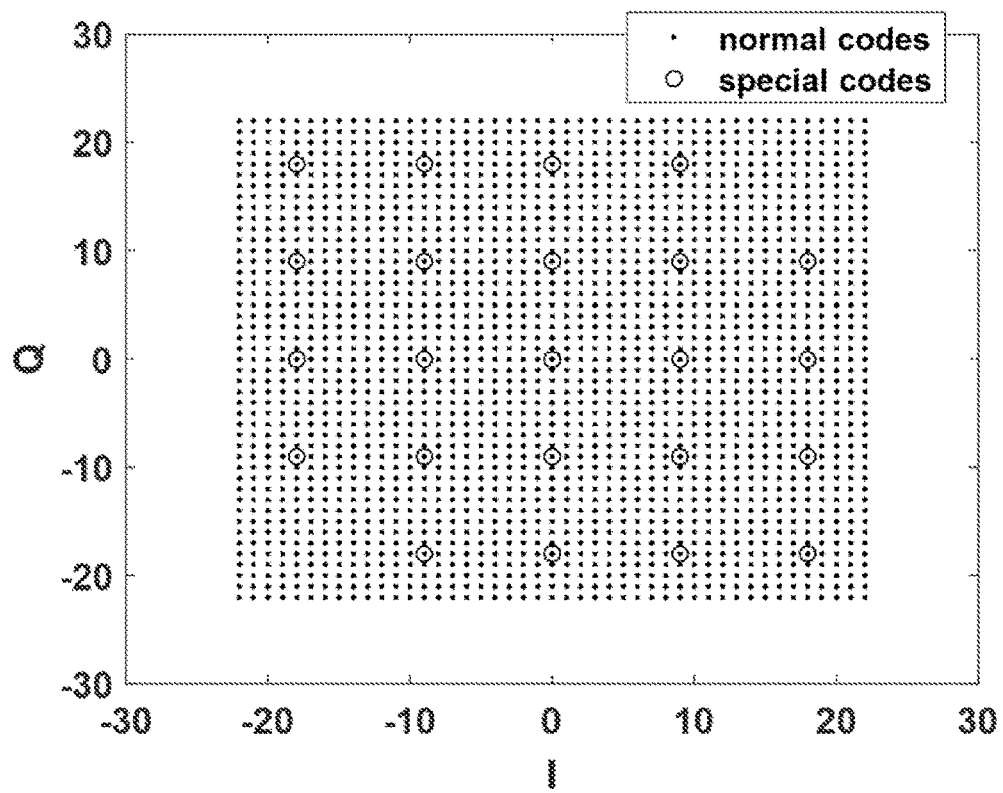
FIG. 7 is a Cartesian co-ordinate system showing an example use of special codes and normal code according to an embodiment.

In the following different possible usages of the special codes U are discussed. FIG. 7 shows an example use of the special codes to signal one control bit for the case with Nm=5.5 bits. The dots represent the 45 2=2025 normal codes used to quantize IQ samples. In this case, the control bit is interpreted as zero by the receiving end. If the transmitter wants to have an active control bit for a given subgroup, e.g. gain change in the analog front end, then the special codes are used (instead of the normal codes) as a much coarser quantization grid, the special codes being represented by a zero in the grid of FIG. 7. Thus, if any of the $U=2^{Nm \cdot G}-M^G=2^{11}-45^2=23$ special codes are sent, the receiving second unit interprets the control bit as set, signifying special event occurred. If the control bit is rarely set, the overall performance loss of the coarser quantization grid will be small. If needed, quantization error in the special code case could be reduced by taking away a few of the normal codes and use these as additional special codes. For example, taking away two corner points from the normal codes and using those to represent the two missing corner points for the special codes (lower left and upper right).

Figure 8:
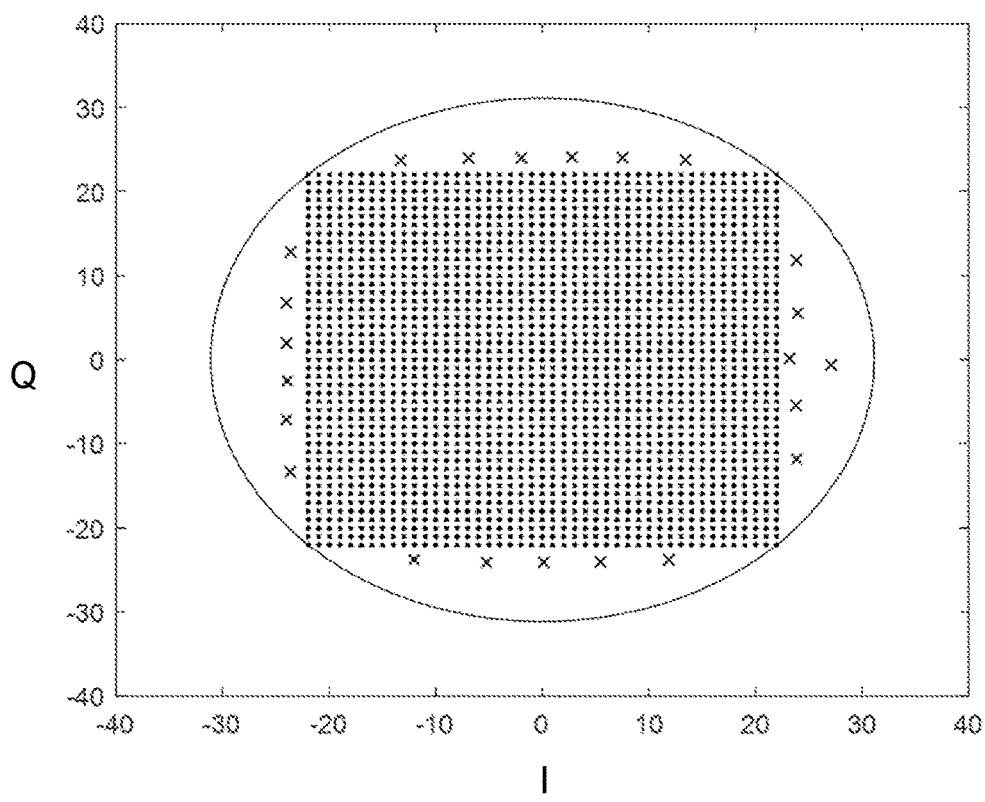
FIG. 8 is a Cartesian co-ordinate system showing another example use of special codes and normal code according to another embodiment.

An alternative use of the special codes is shown in FIG. 8. Here the special codes are used to improve SQNR by slightly extending the value range of the normal codes. In FIG. 8 it is illustrated an example of how the special codes, marked by "x" in FIG. 8, could be used to cover a slightly more circular area in the IQ-plane, decreasing the probability of having to increase the exponent just because some value is slightly too large. This will probably be more important for large blocks. The square-shaped dotted area corresponds to the value range for Cartesian IQ representation with 5.5 bit significand (or scaled value). In this case, one subgroup contains one complex IQ sample. From the central limit theorem, signals in mobile communication systems can often be approximated by a complex Gaussian distribution. Since the probability mass function (PMF) of a complex Gaussian signal has circular contours, a square shape is not a perfect fit. Thus, the special codes could be distributed over at least part of the empty area in the circle, preferably close to the center of the sides of the square, where the PMF takes larger values. This might allow a smaller exponent for the whole block of samples, which is especially important for large blocks where an increased exponent penalizes many samples. Even if the number of special codes is small, there might be a benefit. Here, one example of how to distribute the special codes is indicated, using small "x" symbols for each special code. The locations of the special codes have been determined using a "K-means" clustering algorithm based on complex Gaussian PMF but other methods are also possible, e.g. "K-medoid", or e.g. random placement. Of course, another distribution may be used if the signal does not fit a complex Gaussian distribution.

Figure 9:
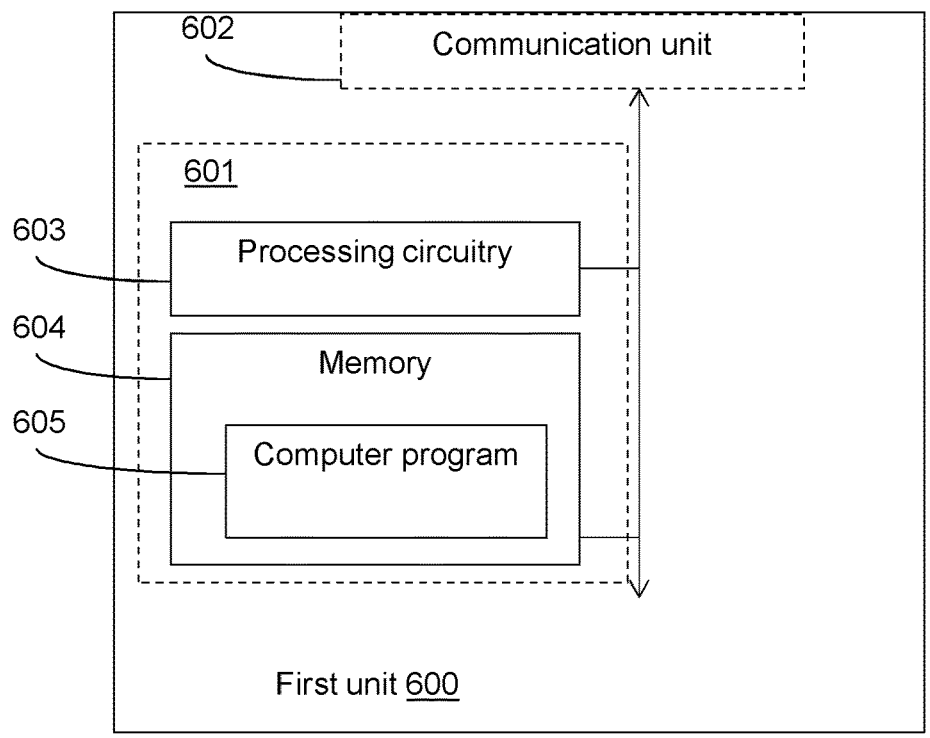
FIG. 9 is schematic block diagram illustrating a first unit in more detail, according to further possible embodiments.

FIG. 9, in conjunction with FIG. 1, shows a first unit 600 of a base station system 100 operable in a wireless communication network, configured for handling a signal for transmission over a fronthaul link 165 between the first unit and a second unit of the base station system. The base station system comprises a base unit 170 and a remote unit 160. The remote unit 160 is arranged to transmit the signal wirelessly to, and receive from, one or more wireless communication devices 180. Further, the first unit is the base unit 170 and the second unit is the remote unit 160, or the first unit is the remote unit 160 and the second unit is the base unit 170. The first unit 600 comprises a processing circuitry 603 and a memory 604. The memory contains instructions executable by said processing circuitry, whereby the first unit 600 is operative for receiving the signal comprising at least one complex value, each complex value consisting of two subparts, a real part and an imaginary part, the subparts each being represented by a first number of bits, and transmitting the signal over the fronthaul link 165 to the second unit, wherein at least two subparts of the at least one complex value are represented in a subgroup, the subgroup being a binary codeword comprising an integer number (L) of bits that is a multiple (G) of a second non-integer (Nm) number of bits allocated per subpart, the second non-integer number of bits being fewer than the first number of bits.

According to an embodiment, the multiple (G) of the non-integer number of bits (Nm) per subpart is selected as the smallest integer that result in the number (L) of bits of the subgroup being an integer.

According to another embodiment, within the subgroup, the at least two subparts, each being represented by the second number of bits (Nm), each can take on M=floor ($2^{Nm}$) different values, resulting in $M^G$ different values of the codeword being used for representing the at least two (G) subparts. Further, the first unit and the second unit each has knowledge of the $M^G$ different values and how they are represented in the codeword.

According to another embodiment, at least one of additional values $U=2^{Nm\cdot G}-M^G$ of the codeword are used for indicating an Automatic Gain Control (AGC) change of a receiver of the first unit from a first range to a second range. Further, the first unit is operative for obtaining information that an AGC change has been performed, and transmitting, in response to the obtaining of information of an AGC change, any of the at least one additional U values of the codeword to the second unit, instead of transmitting any of the $M^G$ values, the first and the second unit in advance knowing the representation of each of the at least one additional U values.

According to an alternative embodiment, at least one of additional values $U=2^{Nm\cdot G}-M^G$ of the codeword are used for indicating values of any of the at least two subparts being outside the $M^G$ different values.

According to another embodiment, the first unit is further operative for scaling the at least two subparts using the same scaling factor. Further, the second number of bits (Nm) are used for representing scaled values of the at least two subparts. Still further, the first unit is operative for transmitting the signal by transmitting the subgroup in a block, the block comprising, except for the subgroup, one or more additional bits representing the scaling factor common to the at least two subparts in the subgroup.

According to another embodiment, the block comprises the subgroup and at least one additional subgroup, each additional subgroup comprising scaled values of at least two subparts, the block further comprising additional bits for each additional subgroup, the additional bits representing a scale factor common to the subparts in each additional subgroup.

According to another embodiment, the first unit is further operative for obtaining information of a bandwidth limitation over the fronthaul link 165, determining, based on the obtained bandwidth limitation information, the second non-integer number of bits (Nm) available per subpart, and sending information of the determined second non-integer number of bits (Nm) to the second unit.

According to yet another embodiment, the first unit is further operative for quantizing the subparts individually using a scalar codebook.

According to other embodiments, the first unit 600 may further comprise a communication unit 602, which, in case the first unit 600 is the remote unit 160 may be considered to comprise conventional means for wireless communication with the wireless communication devices 180, such as a transceiver for wireless transmission and reception of signals. The communication unit 602 may also comprise conventional means for communication with the base unit, in case the first unit is the remote unit 160, and with the remote unit and with other radio access network nodes of the wireless communication network 100, in case the first unit is the base unit 170. The instructions executable by said processing circuitry 603 may be arranged as a computer program 605 stored e.g. in said memory 604. The processing circuitry 603 and the memory 604 may be arranged in a sub-arrangement 601. The sub-arrangement 601 may be a micro-processor and adequate software and storage therefore, a Programmable Logic Device, PLD, or other electronic component(s)/processing circuit(s) configured to perform the methods mentioned above. The processing circuitry 603 may comprise one or more programmable processor, application-specific integrated circuits, field programmable gate arrays or combinations of these adapted to execute instructions.

The computer program 605 may be arranged such that when its instructions are run in the processing circuitry, they cause the first unit 600 to perform the steps described in any of the described embodiments of the first unit 600 and its method. The computer program 605 may be carried by a computer program product connectable to the processing circuitry 603. The computer program product may be the memory 604, or at least arranged in the memory. The memory 604 may be realized as for example a RAM (Random-access memory), ROM (Read-Only Memory) or an EEPROM (Electrical Erasable Programmable ROM). Further, the computer program 605 may be carried by a separate computer-readable medium, such as a CD, DVD or flash memory, from which the program could be downloaded into the memory 604. Alternatively, the computer program may be stored on a server or any other entity to which the first unit 6000 has access via the communication unit 602. The computer program 605 may then be downloaded from the server into the memory 604.

Figure 10:
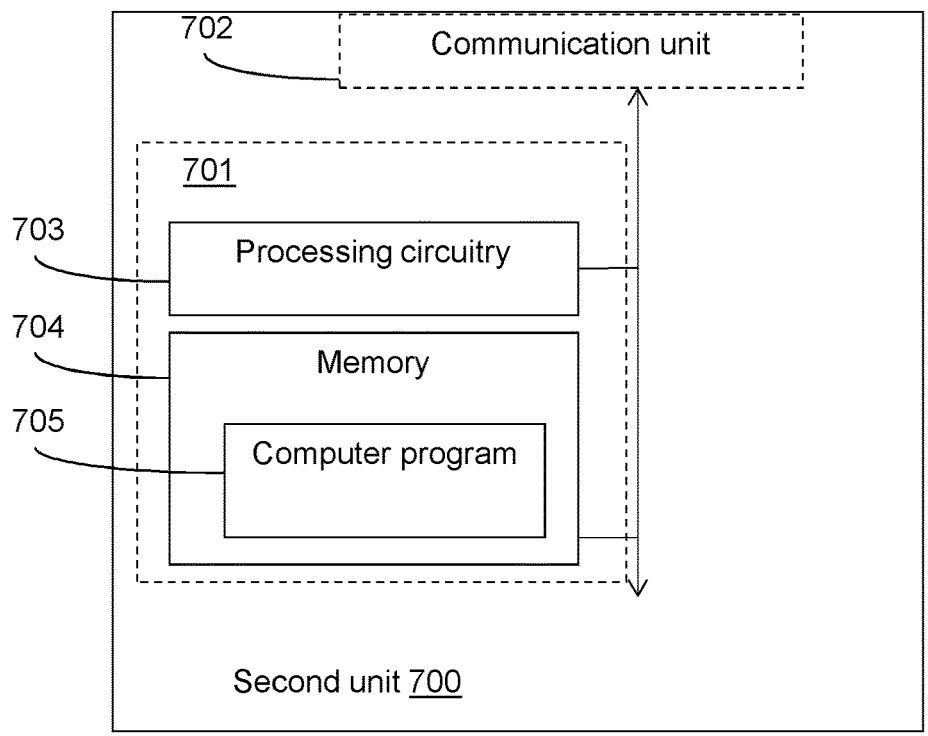
FIG. 10 is schematic block diagram illustrating a second unit in more detail, according to further possible embodiments.

FIG. 10, in conjunction with FIG. 1, shows a second unit 700 of a base station system 100 operable in a wireless communication network, configured for handling a signal for transmission over a fronthaul link 165 between a first unit and the second unit of the base station system. The base station system comprises a base unit 170 and a remote unit 160. The remote unit 160 is arranged to transmit the signal wirelessly to, and receive from, one or more wireless communication devices 180. The first unit is the base unit 170 and the second unit is the remote unit 160, or the first unit is the remote unit 160 and the second unit is the base unit 170. The second unit 700 comprises a processing circuitry 703 and a memory 704. Said memory contains instructions executable by said processing circuitry, whereby the second unit 700 is operative for receiving the signal over the fronthaul link 165 from the first unit, the signal representing at least one complex value consisting of two subparts, a real part and an imaginary part, each subpart being represented by a non-integer (Nm) number of bits, the signal comprising a subgroup comprising at least two subparts of the at least one complex value, the subgroup being a binary codeword consisting of an integer number (L) of bits that is a multiple (G) of the non-integer (Nm) number of bits per subpart, and decoding the at least two subparts from the received binary codeword based on the received signal comprising the codeword, information of the non-integer number of bits and on knowledge of the representation of each subpart by the non-integer number of bits.

According to an embodiment, the second unit is further operative for receiving the information of the non-integer number of bits from the first unit.

According to an embodiment, within the subgroup, the at least two subparts, each being represented by the second number of bits (Nm), each can take on M=floor ($2^{Nm}$) different values, resulting in $M^G$ different values of the codeword being used for representing the at least two (G)

subparts, and wherein the first unit and the second unit each has knowledge of the $M^G$ different values and how they are represented in the codeword.

According to an embodiment, at least one of additional values $U=2^{Nm \cdot G}-M^G$ of the codeword are used for indicating an Automatic Gain Control (AGC) change of a receiver of the first unit from a first range to a second range. Further, the second unit is operative for receiving any of the additional U values of the codeword from the first unit, instead of receiving any of the $M^G$ values, the first unit and the second unit in advance knowing the representation of each of the at least one additional U values.

According to another embodiment, the second number of bits (Nm) are used for representing scaled values of the at least two subparts. Further, the second unit is operative for receiving the signal by receiving the subgroup in a block, the block comprising, except for the subgroup, one or more additional bits representing a scaling factor common to the at least two subparts in the subgroup.

According to other embodiments, the second unit 700 may further comprise a communication unit 702, which, in case the second unit 700 is the remote unit 160 may be considered to comprise conventional means for wireless communication with the wireless communication devices 180, such as a transceiver for wireless transmission and reception of signals. The communication unit 702 may also comprise conventional means for communication with the base unit, in case the second unit 700 is the remote unit 160, and with the remote unit and with other radio access network nodes of the wireless communication network 100, in case the second unit 700 is the base unit 170. The instructions executable by said processing circuitry 703 may be arranged as a computer program 705 stored e.g. in said memory 704. The processing circuitry 703 and the memory 704 may be arranged in a sub-arrangement 701. The sub-arrangement 701 may be a micro-processor and adequate software and storage therefore, a Programmable Logic Device, PLD, or other electronic component(s)/processing circuit(s) configured to perform the methods mentioned above. The processing circuitry 703 may comprise one or more programmable processor, application-specific integrated circuits, field programmable gate arrays or combinations of these adapted to execute instructions.

The computer program 705 may be arranged such that when its instructions are run in the processing circuitry, they cause the second unit 700 to perform the steps described in any of the described embodiments of the second unit 700 and its method. The computer program 705 may be carried by a computer program product connectable to the processing circuitry 703. The computer program product may be the memory 704, or at least arranged in the memory. The memory 704 may be realized as for example a RAM (Random-access memory), ROM (Read-Only Memory) or an EEPROM (Electrical Erasable Programmable ROM). Further, the computer program 705 may be carried by a separate computer-readable medium, such as a CD, DVD or flash memory, from which the program could be downloaded into the memory 704. Alternatively, the computer program may be stored on a server or any other entity to which the second unit 700 has access via the communication unit 702. The computer program 705 may then be downloaded from the server into the memory 704.

Although the description above contains a plurality of specificities, these should not be construed as limiting the scope of the concept described herein but as merely providing illustrations of some exemplifying embodiments of the described concept. It will be appreciated that the scope of the presently described concept fully encompasses other embodiments which may become obvious to those skilled in the art, and that the scope of the presently described concept is accordingly not to be limited. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for an apparatus or method to address each and every problem sought to be solved by the presently described concept, for it to be encompassed hereby. In the exemplary figures, a broken line generally signifies that the feature within the broken line is optional.

The invention claimed is:

1. A method performed by a first unit of a base station system of a wireless communication network for handling a signal for transmission over a fronthaul link between the first unit and a second unit of the base station system, the base station system comprising a base unit and a remote unit, the remote unit being arranged to transmit the signal wirelessly to, and receive from, one or more wireless devices, and one of (A) the first unit is the base unit and the second unit is the remote unit, and (B) the first unit is the remote unit and the second unit is the base unit, the method comprising:
receiving the signal comprising at least one complex value, each complex value consisting of two subparts, a real part and an imaginary part, the subparts each being represented by a first number of bits; and
transmitting the signal over the fronthaul link to the second unit, at least two subparts of the at least one complex value being represented in a subgroup, the subgroup being a binary codeword comprising an integer number (L) of bits that is a multiple (G) of a second non-integer (Nm) number of bits allocated per subpart, the second non-integer number of bits being fewer than the first number of bits.

2. The method according to claim 1, wherein the multiple (G) of the non-integer number of bits (Nm) per subpart is selected as the smallest integer that result in the number (L) of bits of the subgroup being an integer.

3. The method according to claim 1, wherein within the subgroup, the at least two subparts, each being represented by the second number of bits (Nm), each can take on M=floor (2Nm) different values, resulting in MG different values of the codeword being used for representing the at least two (G) subparts, and wherein the first unit and the second unit each has knowledge of the MG different values and how they are represented in the codeword.

4. The method according to claim 3, wherein the at least two subparts are represented as MG−1·x1+MG−2·x2+ . . . +xG or M0·x1+M1·x2+ . . . +MG−1·xG in the Nm·G bit long codeword, wherein xn (n=1, . . . , G) is any of 0 to M−1 different values representing the subpart xn.

5. The method according to claim 3, wherein at least one of additional values U=2Nm·G−MG of the codeword are used for indicating an Automatic Gain Control (AGC) change of a receiver of the first unit from a first range to a second range, the method further comprising:
obtaining information that an AGC change has been performed; and
transmitting, in response to the obtaining of information of an AGC change, any of the at least one additional U values of the codeword to the second unit, instead of transmitting any of the MG values, the first and the second unit in advance knowing the representation of each of the at least one additional U values.

6. The method according to claim 5, wherein the additional U values of the codeword indicate different values of the at least two subparts in the second value range.

7. The method according to claim 3, wherein there will be U=2Nm·G−MG additional values left of the codeword, at least one of additional values U of the codeword are used for indicating values of any of the at least two subparts being outside the MG different values.

8. The method according to claim 1, further comprising:
scaling the at least two subparts using the same scaling factor, and wherein the second number of bits (Nm) are used for representing scaled values of the at least two subparts, wherein the transmitting of the signal comprises transmitting the subgroup in a block, the block comprising, except for the subgroup, one or more additional bits representing the scaling factor common to the at least two subparts in the subgroup.

9. The method according to claim 8, wherein the block comprises the subgroup and at least one additional subgroup, each additional subgroup comprising scaled values of at least two subparts, the block further comprising additional bits for each additional subgroup, the additional bits representing a scale factor common to the subparts in each additional subgroup.

10. The method according to claim 1, further comprising:
obtaining information of a bandwidth limitation over the fronthaul link;
determining, based on the obtained bandwidth limitation information, the second non-integer number of bits (Nm) available per subpart; and
sending information of the determined second non-integer number of bits (Nm) to the second unit.

11. The method according to claim 1, further comprising:
quantizing the subparts individually using a scalar codebook.

12. A method performed by a second unit of a base station system of a wireless communication network for handling a signal for transmission over a fronthaul link between the first unit and a second unit of the base station system, the base station system comprising a base unit and a remote unit, the remote unit being arranged to transmit the signal wirelessly to, and receive from, one or more wireless communication devices, and one of (A) the first unit is the base unit and the second unit is the remote unit, and (B) the first unit is the remote unit and the second unit is the base unit, the method comprising:
receiving the signal over the fronthaul link from the first unit, the signal representing at least one complex value consisting of two subparts, a real part and an imaginary part, each subpart being represented by a non-integer (Nm) number of bits, the signal comprising a subgroup comprising at least two subparts of the at least one complex value, the subgroup being a binary codeword consisting of an integer number (L) of bits that is a multiple (G) of the non-integer (Nm) number of bits per subpart; and
decoding the at least two subparts from the received binary codeword based on the received signal comprising the codeword, information of the non-integer number of bits and on knowledge of the representation of each subpart by the non-integer number of bits.

13. The method according to claim 12, further comprising receiving the information of the non-integer number of bits from the first unit.

14. The method according to claim 12, wherein within the subgroup, the at least two subparts, each being represented by the second number of bits (Nm), each can take on M=floor (2Nm) different values, resulting in MG different values of the codeword being used for representing the at least two (G) subparts, and wherein the first unit and the second unit each has knowledge of the MG different values and how they are represented in the codeword.

15. The method according to claim 14, wherein at least one of additional values U=2Nm·G−MG of the codeword are used for indicating an Automatic Gain Control (AGC) change of a receiver of the first unit from a first range to a second range, the method further comprising receiving any of the additional U values of the codeword from the first unit, instead of receiving any of the MG values, the first and the second unit in advance knowing the representation of each of the at least one additional U values.

16. The method according to any of claim 12, wherein the second number of bits (Nm) are used for representing scaled values of the at least two subparts, wherein the receiving of the signal comprises receiving the subgroup in a block, the block comprising, except for the subgroup, one or more additional bits representing a scaling factor common to the at least two subparts in the subgroup.

17. A first unit of a base station system operable in a wireless communication network configured for handling a signal for transmission over a fronthaul link between the first unit and a second unit of the base station system, the base station system comprising a base unit and a remote unit, the remote unit being arranged to transmit the signal wirelessly to, and receive from, one or more wireless communication devices, and one of (A) the first unit is the base unit and the second unit is the remote unit, and (B) the first unit is the remote unit and the second unit is the base unit, the first unit comprising:
processing circuitry; and
memory, said memory containing instructions executable by the processing circuitry, to configure the first unit:
receive the signal comprising at least one complex value, each complex value consisting of two subparts, a real part and an imaginary part, the subparts each being represented by a first number of bits; and
transmit the signal over the fronthaul link to the second unit, at least two subparts of the at least one complex value being represented in a subgroup, the subgroup being a binary codeword comprising an integer number (L) of bits that is a multiple (G) of a second non-integer (Nm) number of bits allocated per subpart, the second non-integer number of bits being fewer than the first number of bits.

18. The first unit according to claim 17, wherein the multiple (G) of the non-integer number of bits (Nm) per subpart is selected as the smallest integer that result in the number (L) of bits of the subgroup being an integer.

19. The first unit according to claim 17, wherein within the subgroup, the at least two subparts, each being represented by the second number of bits (Nm), each can take on M=floor (2Nm) different values, resulting in MG different values of the codeword being used for representing the at least two (G) subparts, and wherein the first unit and the second unit each has knowledge of the MG different values and how they are represented in the codeword.

20. The first unit according to claim 19, wherein at least one of additional values U=2Nm·G−MG of the codeword are used for indicating an Automatic Gain Control (AGC) change of a receiver of the first unit from a first range to a second range, the first unit being operative for:

obtaining information that an AGC change has been performed; and transmitting, in response to the obtaining of information of an AGC change, any of the at least one additional U values of the codeword to the second unit, instead of transmitting any of the MG values, the first and the second unit in advance knowing the representation of each of the at least one additional U values.

\* \* \* \* \*